United States Patent [19]
Ohkubo

[11] Patent Number: 5,710,439
[45] Date of Patent: Jan. 20, 1998

[54] OPTOELECTRONIC INTEGRATED DEVICE HAVING OPTICAL ELEMENTS AND ELECTRONIC ELEMENTS GROWN IN A MONOLITHIC FORM ON A GAAS SSUBSTRATE

[75] Inventor: Michio Ohkubo, Fujisawa, Japan

[73] Assignee: The Furukawa Electric Co., Ltd., Tokyo, Japan

[21] Appl. No.: 770,552

[22] Filed: Dec. 23, 1996

[30] Foreign Application Priority Data

Feb. 1, 1996 [JP] Japan ................ 8-016270

[51] Int. Cl.$^6$ ............ H01L 31/0328; H01L 31/0336; H01L 31/072; H01L 31/109
[52] U.S. Cl. ............ 257/85; 257/184; 257/187; 257/96; 257/97; 257/103; 257/466; 372/48; 372/50
[58] Field of Search ............ 257/95, 96, 97, 257/94, 85, 184, 190, 187, 197, 466, 458, 103; 372/50, 48

[56] References Cited

U.S. PATENT DOCUMENTS

| | | | |
|---|---|---|---|
| 4,719,498 | 1/1988 | Wada et al. | 257/466 X |
| 5,023,686 | 6/1991 | Helmut et al. | 257/184 X |
| 5,101,246 | 3/1992 | Onodera | 372/50 |
| 5,170,228 | 12/1992 | Sasaki | 257/184 |
| 5,408,120 | 4/1995 | Manabe et al. | 257/94 X |
| 5,619,521 | 4/1997 | Tanaka | 372/50 |

*Primary Examiner*—William Mintel
*Attorney, Agent, or Firm*—Frishauf, Holtz, Goodman, Langer & Chick, P.C.

[57] ABSTRACT

In an optoelectronic integrated device having an optical element section in the wavelength region of 1.33 to 1.55 μm and an electronic element section such as an HEMT integrated in a monolithic form on a GaAs substrate, the optical element section includes light receiving elements or light emitting elements, and an optical absorption layer of the light receiving element or a semiconductor layer forming an active layer of the light emitting element is formed of GaAsN-series compound semiconductor which is lattice-matching with the GaAs substrate, particularly, one of GaAsN, InGaAsN, InGaAsPN, GaAlAsN, InGaLAsN, AlGaAsPN and InGaAlAsPN.

12 Claims, 3 Drawing Sheets

OPTOELECTRONIC INTEGRATED DEVICE HAVING OPTICAL ELEMENTS AND ELECTRONIC ELEMENTS GROWN IN A MONOLITHIC FORM ON A GAAS SSUBSTRATE

BACKGROUND OF THE INVENTION

1. Field of the Invention

This invention relates to an optoelectronic integrated device of high reliability having optical elements for receiving or emitting light in the wavelength region of 1.3 to 1.55 µm and electronic elements such as transistors integrated in a monolithic form on a GaAs substrate.

2. Description of the Related Art

In a case where a compact photoelectric interface between an optical communication network and an electronic circuit is formed, an optoelectronic integrated device having optical elements and electronic elements integrated in a monolithic form plays an extremely important role.

In the optical communication using light having the wavelength of 1.3 to 1.55 µm, an InP-series optical element is exclusively used. That is, an InP-series laser formed by growing InGaAsP or InGaAs as an active layer on an InP substrate and an InP-series photodiode formed by growing InGaAsP or InGaAs as an optical absorption layer on the InP substrate are used.

The technique for forming electronic elements such as transistors on a GaAs substrate is established, but it is still technically difficult to form this type of electronic element on the InP substrate, the reliability thereof is low and the manufacturing cost is high. Therefore, it is difficult to form an optoelectronic integrated device having optical elements and electronic elements integrated in a monolithic form on the InP substrate. Further, the technique for realizing the optoelectronic integrated device is studied in combination with a Si-substrate, but many problems are expected to emerge.

The optical element of GaAs series has an excellent characteristic for light in the wavelength region of 0.8 µm and the reliability thereof is high. However, it is difficult to form an optical element having an excellent characteristic for light in the wavelength region of 1.3 to 1.55 µm by using the GaAs substrate.

This invention is completed against the background that studies of III-V Group compound semiconductor of nitrogen series have been actively carried on, the kind of the transition type of the band structure thereof and the physical property of the crystal structure have been made clear and, particularly, the specific band structure of GaAsN has been made clear.

The relation between the band gap and the lattice constant of III-V Group compound semiconductor is shown in FIG. 3. Data shown in FIG. 3 is obtained by adding data of GaAsN-series compound semiconductor to data of known compound semiconductors such as GaAs and InAs.

As shown in FIG. 3, the band gap of $GaAs_{1-x}N_x$ turns out "0" and gets into a metal state or semi-metal state when the composition ratio X of nitrogen (N) is 0.1. However, $GaAs_{1-x}N_x$ becomes direct transition type semiconductor when the composition ratio X of nitrogen (N) becomes smaller than 0.1. Particularly, when the composition ratio X of nitrogen (N) is approaching 0, that is, when the composition thereof is getting similar to the composition of GaAs, the band gap of $GaAs_{1-x}N_x$ grows into approx. 1.42 eV.

The band gap of semiconductor relates closely to the absorption edge wavelength of the semiconductor layer and the absorption edge wavelength can be derived as a value obtained by dividing the Plank's constant h ($=6.6256 \times 10^{-34}$ J.s) by the band gap. Therefore, given a case with 1.42 eV in the band gap of the semiconductor layer corresponds to a case with 0.87 µm in the absorption edge wavelength of the semiconductor layer.

As shown in FIG. 3, GaAsN which is used as direct transition type semiconductor is smaller in lattice constant than GaAs. The lattice-mismatching percentage between GaAsN and GaAs is less than 2%.

Further, as shown in FIG. 3, if indium (In) is added to GaAsN, the lattice constant thereof becomes larger than that of GaAsN and the band gap becomes smaller. If phosphorus (P) is added to GaAsN, the lattice constant thereof becomes smaller and the band gap becomes smaller. Further, if aluminum (Al) is added to GaAsN, the lattice constant thereof is kept substantially unchanged while the band gap becomes larger.

SUMMARY OF THE INVENTION

An object of this invention is to provide an optoelectronic integrated device which has optical elements, such as light receiving elements or light emitting elements for receiving/emitting light in the wavelength region of 1.3 to 1.55 µm, and electronic elements such as transistors integrated in a monolithic form on a GaAs substrate. More specifically, the object of this invention is to provide an optoelectronic integrated device having a structure such that the optical absorption layer of the light receiving element or the active layer of the light emitting element is made of GaAsN-series compound semiconductor which is formed in lattice-matching with the GaAs substrate.

Preferably, the GaAsN-series compound semiconductor is GaAsN, InGaAsN, InGaAsPN, GaAlAsN, InGaAlAsN, AlGaAsPN or InGaAlAsPN.

Further, this invention is characterized in that high electron mobility transistors (HEMT), field effect transistors (FET) or hetero junction bipolar transistors (HBT) are formed as the electronic element section on the GaAs substrate.

According to this invention, the optical absorption layer of the light receiving element or the active layer of the light emitting element is formed of a compound semiconductor in which an adequate amount of In, P, Al is added to GaAsN, which is a direct transition type semiconductor of adequate composition having its composition ratio X of nitrogen (N) set to be smaller than 0.1, so that the compound semiconductor is lattice-matched with the GaAs substrate and has a band gap covering the wavelength region of 1.3 to 1.55 µm.

Thus, according to this invention, electronic elements such as transistors as well as optical elements are formed in a monolithic form on the GaAs substrate, thus making it possible to provide a high-reliability optoelectronic integrated device provided with the electronic elements and the optical elements covering the wavelength region of 1.3 to 1.55 µm.

DETAILED DESCRIPTION OF THE PREFERRED EMBODIMENTS

Figure 1:
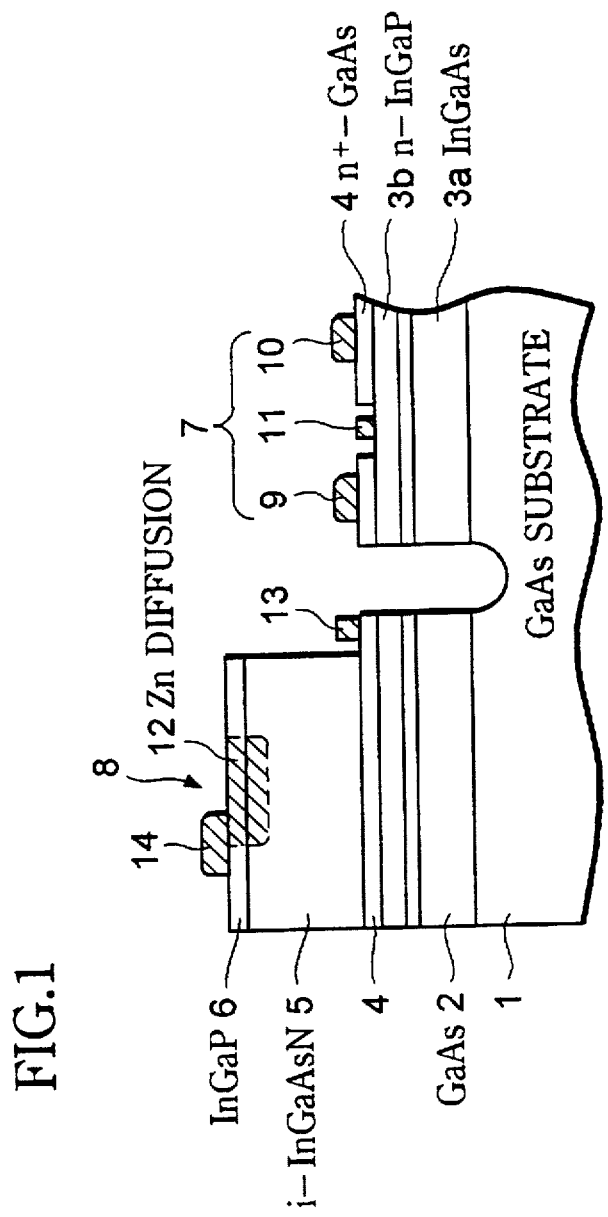
FIG. 1 is a cross sectional view showing the structure of an optoelectronic integrated device according to the first embodiment of this invention.

An optoelectronic integrated device according to the first embodiment of this invention is realized by integrally forming a photodiode as an optical element and a high electron mobility transistor (HEMT) as an electronic element in a monolithic form on a GaAs substrate. That is, as shown in FIG. 1, the optoelectronic integrated device is realized by sequentially forming a non-doped GaAs buffer layer 2 of 0.5 μm thickness, a non-doped InGaAs channel layer 3a of 0.05 μm thickness, an n-InGaP carrier supply layer 3b of 0.3 μm thickness, and an n$^+$-GaAs contact layer 4 of 0.3 μm thickness on a semi-insulative GaAs substrate 1.

After this, a forming region of an HEMT 7 is masked, an i-InGaAsN optical absorption layer 5 of 1 μm thickness is formed on the n$^+$-GaAs contact layer 4 in a forming region of a photodiode 8 and then a non-doped InGaP cap layer 6 of 0.1 μm thickness is formed. Formation of the above layers is effected while making the layer in lattice-matching with the GaAs substrate 1 by use of the metal organic chemical vapor deposition (MOCVD) method, for example.

After this, by using the process technology such as photolithography, etching or diffusion, a portion between the forming region of the photodiode 8 and the forming region of the HEMT 7 is first etched to a certain depth of the GaAs substrate 1 so as to attain element isolation. Then, Zn is diffused to a certain depth of the i-InGaAsN optical absorption layer 5 from above the non-doped InGaP cap layer 6 in the forming region of the photodiode 8 to form a Zn diffusion layer 12. Next, a passivation film is formed on the non-doped InGaP cap layer 6 and part of the passivation film which lies on the Zn diffusion layer 12 is removed in a ring form so as to form a light receiving region with 30 μm diameter, for example. Then, a ring-form positive electrode 14 formed of Ti/Pt/Au is formed on the light receiving region. Further, a negative electrode 13 is formed on the n$^+$-GaAs contact layer 4 which is partly exposed. Thus, the photodiode 8 is formed in a monolithic form on the GaAs substrate 1.

On the other hand, in the HEMT 7, the n$^+$-GaAs contact layer 4 is partly etched to form a gate region. Then, a source electrode 9 and a drain electrode 10 are respectively formed on the n$^+$-GaAs contact layers 4 which are left behind on both sides of the gate region. Further, a gate electrode 11 is formed on the InGaAs channel layer 3a which forms the gate region. Thus, the HEMT 7 is formed in a monolithic form on the GaAs substrate 1.

The optoelectronic integrated device thus formed was used and the operation thereof as a trans-impedance amplifier was checked, and it was proved that the reception sensitivity which ensures the code error rate $1 \times 10^{-8}$ was −25 dBm with respect to an optical signal of wavelength 1.55 μm transmitted at 2.5 Gbps and the reliability of the operation was high. That is, the optoelectronic integrated device which was considered difficult to be formed with the optical elements and electronic elements integrated in a monolithic form on the GaAs substrate in the prior art could be realized on the GaAs substrate 1.

In the above embodiment, the optical absorption layer 5 is made of InGaAsN, but the optical absorption layer 5 can be made of InGaAsN, InGaAsPN, GaAlAsN, InGaAlAsN, AlGaAsPN or InGaAlAsPN, and in this case, the same effect can be attained. Further, as the electronic element, for example, a field effect transistor (FET) or hetero Junction bipolar transistor (HBT) can be formed instead of the HEMT 7.

An optoelectronic integrated device according to a second embodiment of this invention is realized by integrally forming semiconductor laser as an optical element and an FET as an electronic element in a monolithic form on a GaAs substrate.

Figure 2:
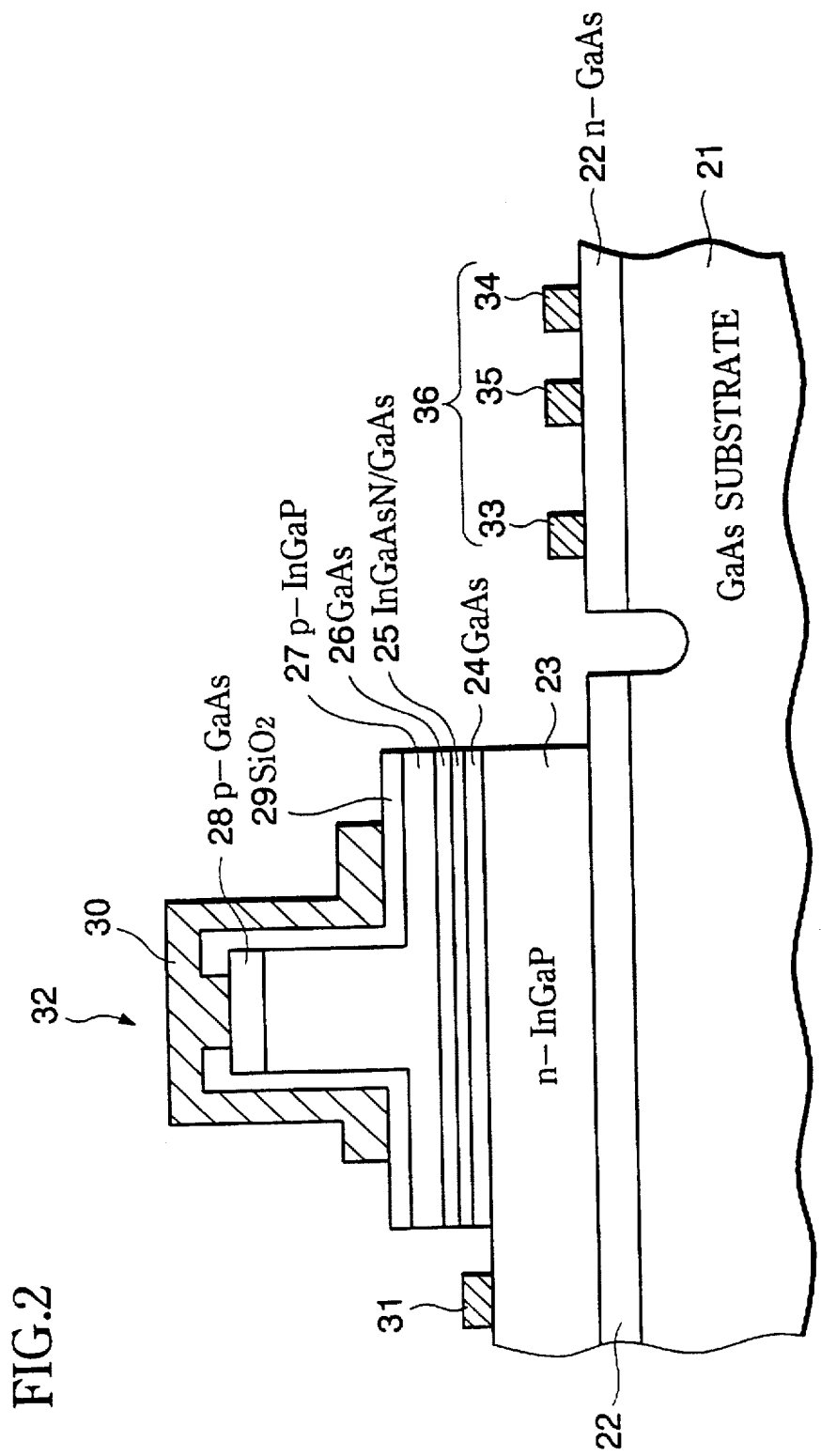
FIG. 2 is a cross sectional view showing the structure of an optoelectronic integrated device according to the second embodiment of this invention.
Figure 3:
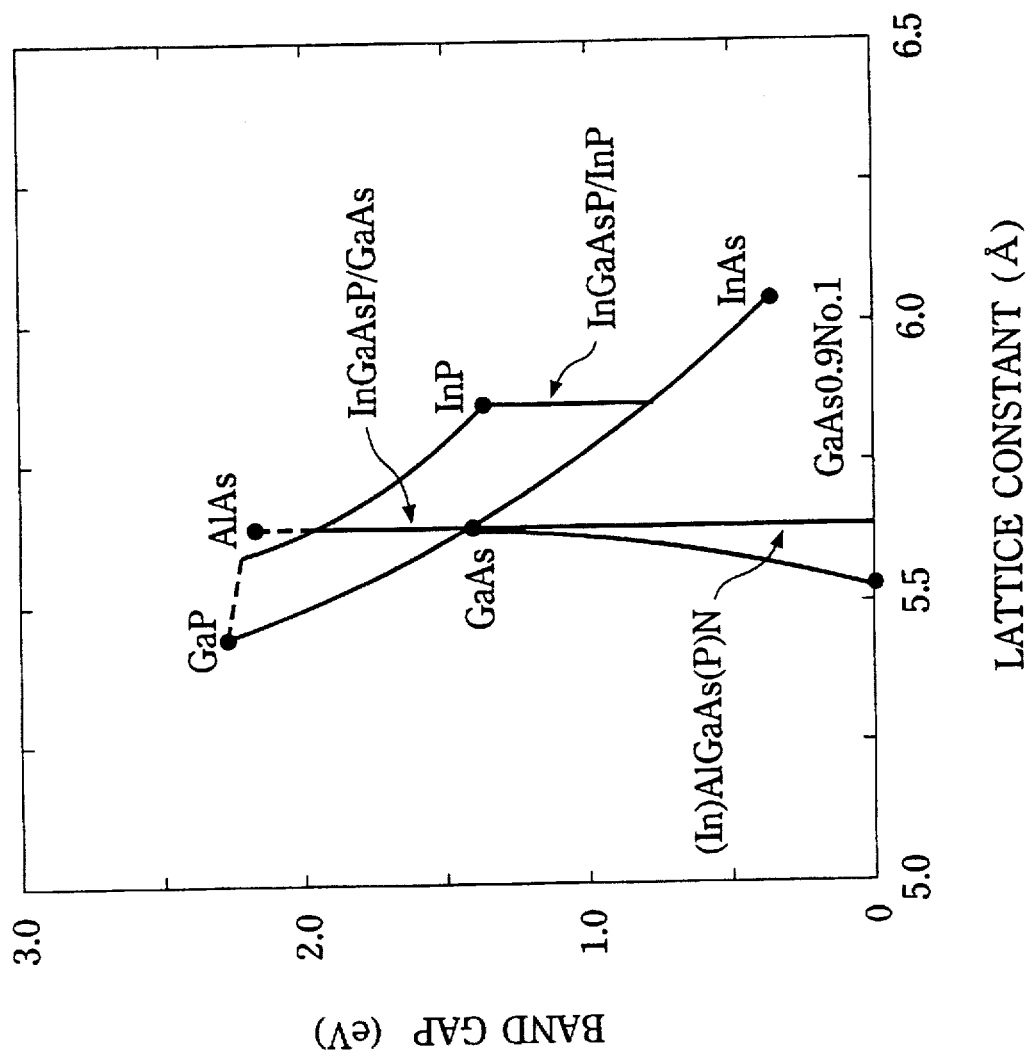
FIG. 3 is a diagram showing the relation between the band gap and the lattice constant of GaAsN-series compound semiconductor.

That is, as shown in FIG. 2, in the case of the above optoelectronic integrated device, an n-GaAs buffer layer 22 of 0.5 μm thickness is first formed on a semi-insulative GaAs substrate 21. Then, a forming region of an FET 36 is masked, and an n-In$_{0.49}$Ga$_{0.51}$P clad layer 23 of 2 μm thickness, a GaAs optical confinement layer 24 of 50 nm thickness, an active layer 25 constructed by the multiple quantum well structure, a GaAs optical confinement layer 26 of 50 nm thickness, a p-In$_{0.49}$Ga$_{0.51}$P clad layer 27 of 0.5 μm thickness, and a p-GaAs cap layer 28 of 0.5 μm thickness are sequentially formed on the n-GaAs buffer layer 22 which lies in the forming region of the semiconductor laser 32. Formation of the above layers is effected while making the layer in lattice-matching with the GaAs substrate 21 by use of the metal organic chemical vapor deposition (MOCVD) method.

The active layer 25 is made of a four-layered quantum well layer consisting of alternate laminating InGaAsN distortion quantum well layers (absorption edge wavelength λg=1.3 μm) of 5 nm thickness and GaAs barrier layers of 5 nm thickness.

Next, by using the process technology such as photolithography or etching, a portion between the forming region of the semiconductor laser 32 and the forming region of the FET 36 is first etched to a certain depth of the GaAs substrate 21 so as to attain interelement isolation. After this, without etching the stripe-form element region of the semiconductor laser 32, portions of the semiconductor laser 32 which lie on both sides of the stripe-form element region thereof are etched to a certain depth of the p-In$_{0.49}$Ga$_{0.51}$P clad layer 27 to form a ridge. Then, an SiO$_2$ film 29 is formed as a current path narrowing layer on the structure except the p-GaAs cap layer 28 which is left behind in the stripe form. Next, a positive electrode 30 is formed on the p-GaAs cap layer 28 and a negative electrode 31 is formed on the exposed portion of the n-In$_{0.49}$Ga$_{0.51}$P clad layer 23.

Thus, the semiconductor laser 32 of ridge waveguide structure is integrated in a monolithic form on the GaAs substrate 21. The width of the ridge waveguide of the semiconductor laser 32 is adjusted to 2 μm, for example. The length of the stripe region is adjusted to 300 μm. A reflecting mirror made of a dielectric multilayered film with reflectance of 60% is formed on one end surface of the stripe region by coating and a reflecting mirror made of a dielectric multilayered film with reflectance of 95% is formed on the other end surface of the stripe region by coating.

In the case of the FET 36, the n-GaAs buffer layer 22 is used as a channel layer, and a source electrode 33 and a drain electrode 34 are formed in ohmic contact with the buffer layer 22. Further, a gate electrode 35 is disposed between the source electrode 33 and the drain electrode 34 and formed in Schottky contact with the buffer layer 22. With this structure, the FET 36 is integrated in a monolithic form on the GaAs substrate 21.

The operation of the semiconductor laser 32 of the thus formed optoelectronic integrated device was checked, and it was confirmed that the oscillation threshold current was 10 mA at 25° C. and a laser beam with the oscillation wavelength of approx. 1.3 μm was obtained. The characteristic temperature To in the range of 10° C. to 85° C. was 130K. The characteristic temperature To indicates the rate of change in the oscillation threshold value with respect to a variation in the temperature and is an index of evaluation indicating that it is less dependent on the temperature and becomes more stable as the value thereof becomes larger. The characteristic temperature To in the general InP-series semiconductor laser is approx. 40 to 80K. Thus, it was confirmed that the semiconductor laser 32 formed in the above-described manner had a stable temperature characteristic.

The improvement of the temperature characteristic can be attained because the active layer 25 formed on the GaAs substrate 21 is made of GaAsN-series compound semiconductor whose band gap is smaller than that of GaAs and the clad layers 23, 27 are made of InGaP or AlGaAs whose band gap is larger than that of GaAs. Therefore, a difference in the band gap between the clad layers 23, 27 and the active layer 25 is adjusted to a value sufficiently larger than in a case wherein GaAs is used as the active layer. As a result, the effect of confining electrons of high energy caused by the temperature rise into the active layer 25 is enhanced and the temperature characteristic is improved.

The improvement of the temperature characteristic is also supported by "Appl. Phys. Lett., vol. 63 712 (1993)" which discloses that the temperature characteristic can be improved by increasing the difference in the band gap by using InGaP having a larger band gap than InP instead of InP to form the clad layer of an InP-series semiconductor laser.

In the above semiconductor laser 32, InGaP is used to form the clad layers 23, 27, but it is possible to use instead AlGaAs or InGaAlP. Further, the active layer 25 is not limited to InAsN and it is possible to use GaAsN-series compound semiconductor.

What is claimed is:

1. An optoelectronic integrated device comprising:
   an optical element section and an electronic element section formed in a monolithic form on a GaAs substrate,
   said optical element section including a light receiving element formed on the GaAs substrate, the light receiving element having an optical absorption layer made of GaAsN-series compound semiconductor.

2. An optoelectronic integrated device comprising:
   an optical element section and an electronic element section formed in a monolithic form on a GaAs substrate,
   said optical element section including a light emitting element formed on the GaAs substrate, the light emitting element having an active layer made of GaAsN-series compound semiconductor.

3. An optoelectronic integrated device according to claim 1, wherein said GaAsN-series compound semiconductor is one selected from a group consisting of GaAsN, InGaAsN, InGaAsPN, GaAlAsN, InGaAlAsN, AlGaAsPN and InGaAlAsPN.

4. An optoelectronic integrated device according to claim 1, wherein said optical element section receives light in the wavelength region of 1.3 to 1.55 μm.

5. An optoelectronic integrated device according to claim 1, wherein said electronic element section includes at least one of a high electron mobility transistor (HEMT), field effect transistor (FET) and hetero junction bipolar transistor (HBT).

6. An optoelectronic integrated device according to claim 2, wherein said GaAsN-series compound semiconductor selected from a group consisting of GaAsN, InGaAsN, InGaAsPN, GaAlAsN, InGaAlAsN, AlGaAsPN and InGaAlAsPN.

7. An optoelectronic integrated device according to claim 2, wherein said optical element section emits light in the wavelength region of 1.3 to 1.55 μm.

8. An optoelectronic integrated device according to claim 3, wherein said optical element section receives light in the wavelength region of 1.3 to 1.55 μm.

9. An optoelectronic integrated device according to claim 6, wherein said optical element section emits light in the wavelength region of 1.3 to 1.55 μm.

10. An optoelectronic integrated device according to claim 2, wherein said electronic element section includes at least one of a high electron mobility transistor (HEMT), field effect transistor (FET) and hereto junction bipolar transistor (HBT).

11. An optoelectronic integrated device according to claim 3, wherein said electronic element section includes at least one of a high electron mobility transistor (HEMT), field effect transistor (FET) and hereto junction bipolar transistor (HBT).

12. An optoelectronic integrated device according to claim 6, wherein said electronic element section includes at least one of a high electron mobility transistor (HEMT), field effect transistor (FET) and hereto junction bipolar transistor (HBT).

* * * * *

UNITED STATES PATENT AND TRADEMARK OFFICE
CERTIFICATE OF CORRECTION

PATENT NO. : 5,710,439
DATED      : January 20, 1998
INVENTOR(S) : OHKUBO

It is certified that error appears in the above-identified patent and that said Letters Patent is hereby corrected as shown below:

Title Page, right column, in the ABSTRACT, 2nd line from the bottom, delete "InGalAsN" and insert --InGaAlAsN--.

Signed and Sealed this

Thirtieth Day of November, 1999

Q. TODD DICKINSON

Attest:

Attesting Officer

Acting Commissioner of Patents and Trademarks